United States Patent [19]

Noguchi

[11] Patent Number: 4,921,817
[45] Date of Patent: May 1, 1990

[54] SUBSTRATE FOR HIGH-INTENSITY LED, AND METHOD OF EPITAXIALLY GROWING SAME

[75] Inventor: Masahiro Noguchi, Ushiku, Japan

[73] Assignees: Mitsubishi Monsanto Chemical Co., Tokyo; Mitsubishi Kasei Corp., Ushiku, both of Japan

[21] Appl. No.: 353,652

[22] PCT Filed: Jul. 6, 1988

[86] PCT No.: PCT/JP88/00677

§ 371 Date: Mar. 8, 1989

§ 102(e) Date: Mar. 8, 1989

[87] PCT Pub. No.: WO89/00769

PCT Pub. Date: Jan. 26, 1989

[30] Foreign Application Priority Data

Jul. 9, 1987 [JP] Japan .................... 62-171839

[51] Int. Cl.$^5$ ............................... H01L 21/20
[52] U.S. Cl. .................... 437/127; 437/117; 437/905; 437/974; 148/DIG. 99; 148/DIG. 108; 148/DIG. 135
[58] Field of Search ............ 437/117, 107, 126, 127, 437/128, 130, 133, 904, 905, 906, 974; 148/DIG. 99, DIG. 101, DIG. 108, DIG. 110, DIG. 135, DIG. 65, DIG. 66

[56] References Cited

U.S. PATENT DOCUMENTS

| | | | |
|---|---|---|---|
| 3,636,617 | 1/1972 | Schmidt et al. | 437/974 |
| 3,640,807 | 2/1972 | Van Dijk | 437/974 |
| 3,647,579 | 3/1972 | Ladany | 437/974 |
| 3,823,043 | 7/1974 | Andre et al. | 437/974 |
| 3,966,513 | 6/1976 | Hallais et al. | 437/974 |
| 4,051,061 | 9/1977 | Bhargava et al. | 437/905 |
| 4,159,354 | 6/1979 | Milnes et al. | 148/DIG. 135 |
| 4,168,998 | 9/1979 | Hasegawa et al. | 437/974 |
| 4,226,649 | 10/1980 | Davey et al. | 437/974 |
| 4,230,505 | 10/1980 | Wu et al. | 437/974 |
| 4,325,073 | 4/1982 | Hughes et al. | 437/974 |
| 4,329,189 | 5/1982 | Noad et al. | 437/117 |
| 4,421,576 | 12/1983 | Jolly | 437/974 |
| 4,477,294 | 10/1984 | Gutierrez et al. | 437/117 |
| 4,648,940 | 3/1987 | Menigaux et al. | 437/117 |
| 4,659,400 | 4/1987 | Garbis et al. | 148/DIG. 135 |
| 4,774,194 | 9/1988 | Hokuyou | 437/974 |

FOREIGN PATENT DOCUMENTS

| | | | |
|---|---|---|---|
| 0031808 | 7/1981 | European Pat. Off. | 437/117 |
| 0094368 | 12/1973 | Japan . | |
| 0008180 | 1/1976 | Japan . | |
| 0086059 | 7/1977 | Japan . | |
| 0023391 | 2/1979 | Japan | 437/905 |
| 0123126 | 9/1980 | Japan | 437/117 |
| 0141769 | 11/1980 | Japan | 437/127 |
| 0165688 | 12/1980 | Japan | 437/905 |
| 0035410 | 4/1981 | Japan | 437/117 |
| 0028375 | 2/1982 | Japan | 437/905 |
| 0154124 | 7/1986 | Japan | 148/DIG. 135 |
| 0281560 | 12/1986 | Japan | 437/127 |
| 0281561 | 12/1986 | Japan | 437/117 |
| 0304614 | 12/1988 | Japan | 437/117 |
| 0312685 | 12/1988 | Japan | 437/905 |

OTHER PUBLICATIONS

Shang, "GaInAs Infrared Emission Device", IBM Technical Disclosure Bulletin, vol. 13, No. 11, Apr. 1971, p. 3440.
Nitta et al., "High-Power and High-Speed GaAlAs--GaAs LEDs Fabricated by MOCVD Growth", Electronics Letts., vol. 21, No. 5, Feb. 28, 1985, pp. 208-209.

Primary Examiner—Brian E. Hearn
Assistant Examiner—M. Wilczewski
Attorney, Agent, or Firm—Armstrong, Nikaido, Marmelstein, Kubovcik & Murray

[57] ABSTRACT

A substrate for a high-intensity LED and the method of epitaxially growing the substrate according to the invention are based on the fact that, in using an AuZn alloy or the like as the ohmic electrode of the p-type $Al_xGa_{1-x}As$ layer (2), the higher the carrier concentration of this layer, the smaller the contact resistance and the lower the applied voltage ($V_F$) necessary for passing a forward current of 10 mA. Joint use is made of gas-phase epitaxy and liquid-phase epitaxy. A layer having a carrier concentration three to five times that of an epitaxial layer formed by liquid-phase epitaxy (LPE) can be realized with excellent reproducibility by gas-phase epitaxy (MOCVD process, MBE process, etc.). By utilizing this p-type $Al_xGa_{1-x}As$ layer (2) as an electrode contact layer, contact resistance can be reduced and variance diminished.

4 Claims, 3 Drawing Sheets

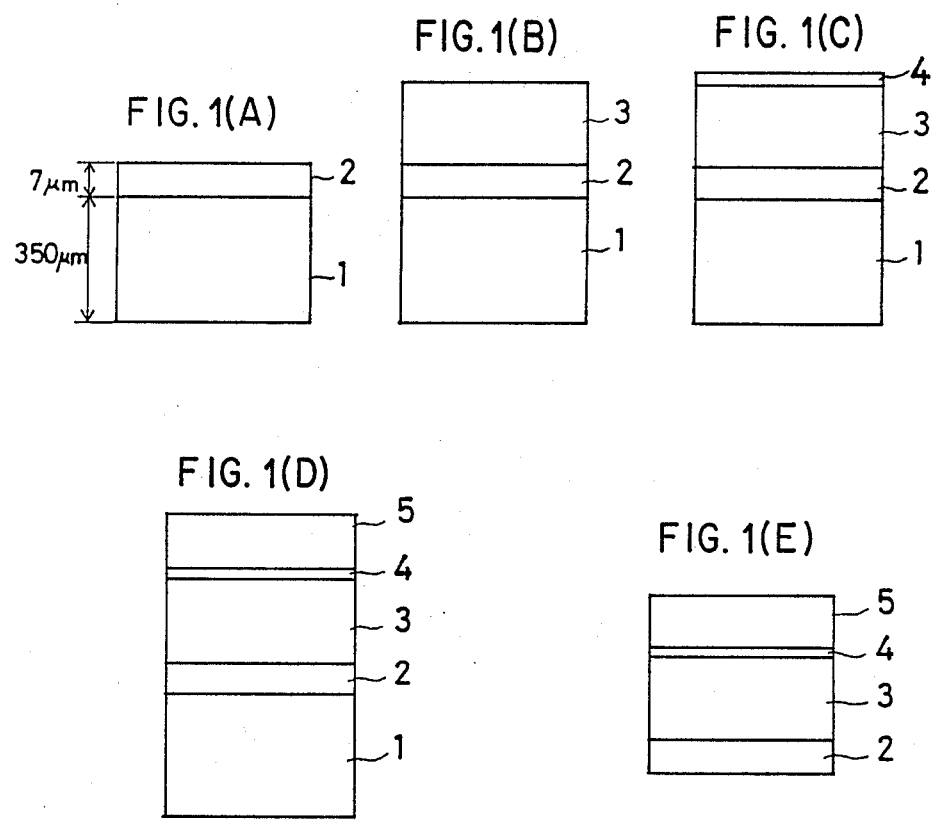
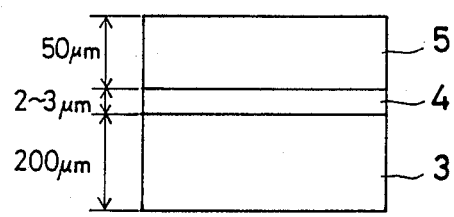

SUBSTRATE FOR HIGH-INTENSITY LED, AND METHOD OF EPITAXIALLY GROWING SAME

DESCRIPTION

1. Technical Field

This invention relates to a method of epitaxially growing a substrate for a high-intensity LED. More particularly, the invention relates to a method of epitaxial growth necessary for forming a stable electrode having little contact resistance and exhibiting ohmic properties for the purpose of manufacturing a high-intensity LED chip.

2. Background Art

In order to epitaxially grow a substrate for, say, a red-light emitting high-intensity LED in the prior art, first a layer of Zn-doped $Al_{0.75}Ga_{0.25}As$ (p-type) is formed as a p-type cladding layer to a thickness of 200 microns on a p-type GaAs substrate [(100) surface] by liquid-phase epitaxy (LPE). This is followed by forming a layer of Zn-doped $Al_{0.35}Ga_{0.65}As$ (p-type) as a p-type active layer to a thickness of 2–3 microns, and then a layer of Te-doped $Al_{0.75}Ga_{0.25}As$ (n-type) as an n-type cladding layer to a thickness of 50 microns. Next, a GaAs substrate-selective etchant (e.g., $NH_4OH$:$H_2O_2 = 1$:7) is used to remove the light-absorptive GaAs substrate, thereby providing a high-intensity LED chip.

In a case where an AuZn electrode is formed on the layer of Zn-doped $Al_{0.75}Ga_{0.25}As$ in accordance with the above-described prior-art method, an epitaxial layer having a carrier concentration of only $3 \times 10^{17}$ cm$^{-3}$ is formed stably by liquid-phase epitaxy. Consequently, the contact resistance is high and a variance occurs in the voltage ($V_F$ value) necessary for passing a current of 20 mA in the forward direction of the light-emitting diode (LED). In addition, the lifetime of the light-emitting diode is adversely affected by heat produced when current flows through the contact resistance.

The present invention is intended to solve the foregoing problems and its object is to provide a method of epitaxially growing a substrate for a high-intensity LED in which, with regard to the carrier concentration of the p-type AlGaAs layer that poses problems in terms of forming a stable electrode having little contact resistance and exhibiting ohmic properties, a p-type AlGaAs layer having a carrier concentration of more than $5 \times 10^{17}$ cm$^{-3}$ is formed in advance by gas-phase epitaxy (MOCVD process, MBE process, etc.), whereby the contact resistance produced between an AuZn electrode and the p-type AlGaAs layer when the electrode is formed can be reduced and variance suppressed.

DISCLOSURE OF THE INVENTION

To this end, a substrate for a high-intensity LED according to the present invention is characterized by comprising a p-type $Al_xGa_{1-x}As$ layer (x>0.3) having a carrier concentration of more than $5 \times 10^{17}$cm$^{-3}$ and a thickness of 3-7 μm, and an epitaxial layer of a hetero structure formed on the p-type $Al_xGa_{1-x}As$ layer, and a method of epitaxially growing the substrate is characterized by comprising a first step of forming a p-type $Al_xGa_{1-x}As$ layer (x>0.3) having a carrier concentration of more than $5 \times 10^{17}$cm$^{-3}$ on a GaAs substrate to a thickness of 3-7 μm by gas-phase epitaxy, a second step of forming an epitaxial layer of a hetero structure by liquid-phase epitaxy, and a third step of removing the GaAs substrate.

The substrate for a high-intensity LED and the method of epitaxially growing the substrate according to the present invention are based on the fact that, in using an AuZn alloy or the like as the ohmic electrode of the p-type $Al_xGa_{1-x}As$ layer, the higher the carrier concentration of this layer, the smaller the contact resistance and the lower the applied voltage ($V_F$) necessary for passing a forward current of 10 mA. Joint use is made of gas-phase epitaxy and liquid-phase epitaxy. A layer having a carrier concentration three to five times that of an epitaxial layer formed by liquid-phase epitaxy (LPE) can be realized with excellent reproducibility by gas-phase epitaxy (MOCVD process, MBE process, etc.). By utilizing this p-type $Al_xGa_{1-x}As$ layer as an electrode contact layer, contact resistance can be reduced and variance diminished.

BRIEF DESCRIPTION OF THE DRAWINGS

FIGS. 1(A) through (E) are process views illustrating a method of performing epitaxial growth according to the present invention;

FIG. 2 is a view illustrating liquid-phase epitaxy in the process of FIG. 1;

BEST MODE FOR CARRYING OUT THE INVENTION

Figure 3:
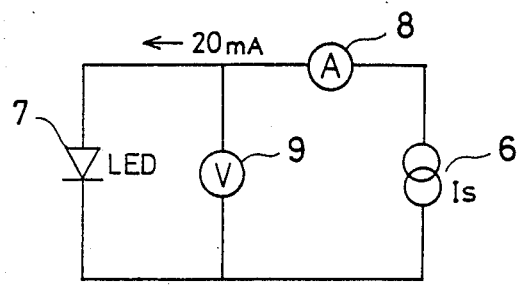
FIG. 3 is a circuit diagram of a $V_F$ measurement circuit.

An embodiment will now be described with reference to the drawings.

FIGS. 1(A) through (E) are process views illustrating a method of epitaxially growing a substrate for a high-intensity LED according to the present invention, and FIG. 2 is an enlarged view illustrating a liquid-phase epitaxy step from among the process steps of FIG. 1. In the Figures, numeral 1 denotes a Zn-doped GaAs substrate, 2 a p-type $Al_{0.7}Ga_{0.3}As$ layer, 3 a p-type $Al_{0.7}Ga_{0.3}As$ layer, 4 an $Al_{0.35}Ga_{0.65}As$ active layer, and 5 an n-type $Al_{0.7}Ga_{0.3}As$ cladding layer.

In a first step, by applying gas-phase epitaxy (MOCVD process, MBE process, etc.), a Zn-doped $Al_{0.7}Ga_{0.3}As$ layer having a carrier concentration of $1 \times 10^{18}$cm$^{-3}$ *was formed to a thickness of* 7 μm on a 350 μm-thick Zn-doped GaAs substrate which is 2° off the (100) surface. The layer was formed using hydrogen ($H_2$), arsine ($AsH_3$), trimethyl gallium [$Ga(CH_3)_3$], trimethyl aluminum [$Al(CH_3)_3$] and diethyl zinc [$C_2H_5)_2$] as the gases at a V/III ratio of 50 [$AsH_3$/{$Ga(CH_3)_3$+$Al(CH_3)_3$}], a total flow rate of 8 l/min and a growth pressure of 40 Torr [see FIG. 1(A)].

Next, in a second step, the surface of this epitaxial wafer formed to have the $Al_{0.7}Ga_{0.3}As$ layer by gas-phase epitaxy had its surface melted back by liquid-phase epitaxy (LPE process) to remove the influence of an oxide film, after which an epitaxial layer having a double-hetero structure was successively formed on the wafer. More specifically, after the temperature was raised to 950° C. in a hydrogen atmosphere, a melt 1 for forming a p-type cladding layer, a melt 2 for forming a p-type active layer, and a melt 3 for forming an n-type cladding layer were successively applied to cover the wafer while the temperature was allowed to drop at a rate of −0.5° C./min, thereby forming the desired epitaxial layer.

The application of each melt will now be described in order.

As for melt 1, the temperature was raised to 950° C. in a hydrogen atmosphere and a p-type $Al_{0.7}Ga_{0.3}As$ layer 3 was formed as a p-type cladding layer having a thickness of 200 μm while allowing the temperature to drop to 780° C. [FIG. 1(B)].

As for melt 2, a p-type $Al_{0.7}Ga_{0.3}As$ layer 4 was formed as a p-type active layer having a thickness of 2 μm while allowing the temperature to drop from 780° C. to 779° C., [FIG. 1(C)].

As for melt 3, an n-type $Al_{0.7}Ga_{0.3}As$ layer 5 was formed as an n-type cladding layer having a thickness of 50 μm while allowing the temperature to drop from 779° C. to 700° C. [FIG. 1(D)].

The light-absorptive GaAs substrate 1 of the epitaxially grown wafer thus grown by the gas-phase epitaxy of the first step and the liquid-phase epitaxy of the second step was selectively removed at a temperature of 23° C. using a selective etchant of $NH_4OH:H_2O_2=1:7$ [FIG. 1(E)].

An ohmic electrode was formed on the LED chip thus obtained. More specifically, an electrode was formed of an electrode material AuZn at an alloying temperature and time of 500° C. and 10 min on the p-type $Al_{0.7}Ga_{0.3}As$ layer 2 (Zn-doped) having a surface carrier concentration of $1 \times 10^{18} cm^{-3}$, and an electrode was formed of an electrode material Au-AuGe-Ni at an alloying temperature and time of 500° C. and 10 min on the n-type $Al_{0.7}Ga_{0.3}As$ layer 5 (Te-doped) having a surface carrier concentration of $1 \times 10^{18} cm^{-3}$.

FIG. 3 is a view illustrating a circuit for measuring a voltage $V_F$ applied to the LED chip, in which numeral 6 denotes a constant-current source, 7 the LED chip, 8 an ammeter, and 9 a voltmeter.

In FIG. 3, measurement of the LED chip according to the invention was performed by supplying the LED chip 7 with a constant current from the constant-source 6 and reading the voltmeter 9 as $V_F$ when the ammeter 8 indicates 20 mA.

(Comparison Example)

As an example for comparison, a double-hetero structure epitaxial layer was grown on a Zn-doped GaAs substrate [on the (100) surface] by liquid-phase epitaxy (LPE process) under conditions the same as those of the embodiment of the invention, the GaAs substrate was subsequently removed, and an electrode was formed under conditions the same as those of the embodiment of the invention.

FIG. 4 is a view illustrating the results of measuring $V_F$ with regard to the present invention and the comparison example.

Figure 4A:
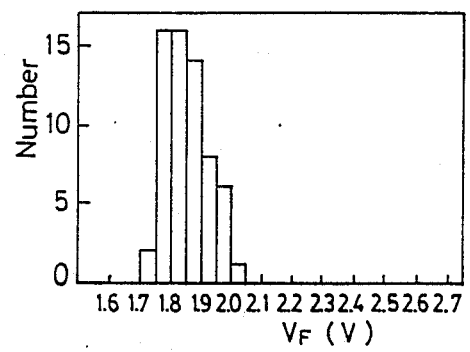
FIGS. 4(A), (B) are views illustrating distributions of applied voltage $V_F$ according to the present invention and an example for comparison.

The voltages $V_F$ applied to 63 samples of LED chips according to the invention are as shown in FIG. 4(A), from which it will be appreciated that there is little variance in the range of low voltages $V_F=1.8-2.0$ V.

Figure 4B:
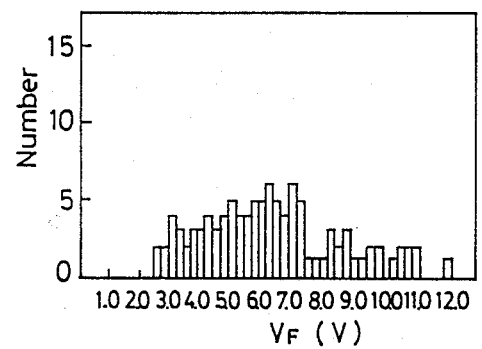

The results illustrated in FIG. 4(B) were obtained with regard to 100 LED chips of the comparison example. It will be appreciated that there is a large amount of variance at high voltages of $V_F=2.5-12.0$ V and over a wide range.

The usefulness of the method of epitaxially growing the high-intensity LED substrate according to the present invention is demonstrated by these results.

Figure 5:
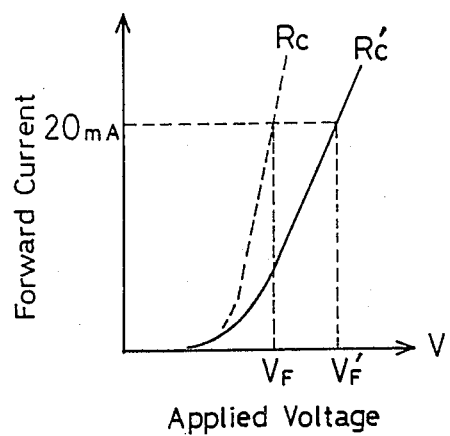
FIG. 5 is a view illustrating the relationship between voltage applied to an LED and forward current.
Figure 6:
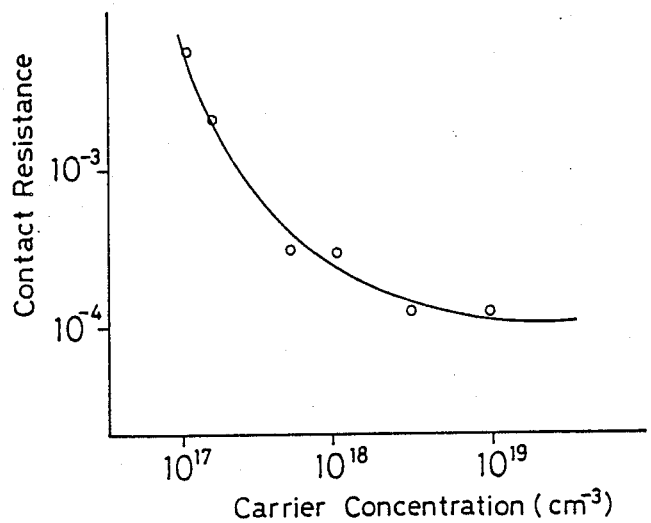
FIG. 6 is a view illustrating the relationship between carrier concentration and resistance.

FIG. 5 is a view illustrating the relationship between the applied voltage and forward current, and FIG. 6 is a view illustrating the relationship between carrier concentration and contact resistance.

The higher the carrier concentration, the smaller the contact resistance, as will be understood from FIG. 6. It will be understood from FIG. 5 that when contact resistance diminishes, $V_F$ becomes small. In accordance with the present invention, therefore, it is possible to realize a chip having a small $V_F$.

Accordingly to the foregoing embodiment, an undoped GaAs substrate is used. However, since there is almost no mutual diffusion with the method of epitaxial growth according to the invention, it is possible to freely select the type of GaAs substrate.

According to the present invention as set forth above, contact resistance when the AuZn electrode is formed can be reduced and it is possible to improve the efficiency and relability of the LED chip. In addition, yield is improved by making joint use of gas-phase epitaxy and liquid-phase epitaxy, and it is possible to obtain the desired chip in a short period of time. Though it is difficult to stabilize the carrier concentration of the p-type cladding layer at more than $5 \times 10^{17} cm^{-3}$ by liquid-phase epitaxy, a stabilized carrier concentration of more than $5 \times 10^{17} cm^{-3}$ is obtained by adopting gas-phase epitaxy. When the carrier concentration of the p-type cladding layer is raised by liquid-phase epitaxy, there is greater diffusion of Zn into the p-type active layer and luminance declines. However, it is possible to avoid this with the method of epitaxial growth of the present invention. Furthermore, the interface between the GaAs substrate and the contact layer is flat and process yield can be greatly improved.

Industrial Applicability

As set forth above, contact resistance when the electrode is formed can be reduced and it is possible to improve the efficiency and reliability of the LED chip. In addition, yield is improved by making joint use of gas-phase epitaxy and liquid-phase epitaxy, and it is possible to obtain the desired chip in a short period of time. The invention therefore has a high utility value in industry.

What is claimed is:

1. A method of epitaxially growing a substrate for a high-intensity LED, comprising a first step of forming a p-type $Al_xGa_{1-x}As$ layer ($x>0.3$) having a carrier concentration of more than $5 \times 10^{17} cm^{-3}$ on a GaAs substrate to a thickness of 3–7 μm by gas-phase epitaxy, a second step of forming a hetero structure epitaxial layer by liquid-phase epitaxy, and a third step of removing the GaAs substrate.

2. A method of epitaxially growing a substrate for a high-intensity LED according to claim 1, wherein 1–5 μm of the epitaxial layer, which is formed by gas-phase epitaxy of the first step, is melted back using an unsaturated melt when liquid-phase epitaxy of said second step is performed, thereby eliminating the influence of an oxide film formed on the surface.

3. A method of epitaxially growing a substrate for a high-intensity LED according to claim 1, wherein a mixed crystal ratio X of a p-type $Al_xGa_{1-x}As$ cladding layer is set to be higher than a mixed crystal ratio of a hetero structure active layer, and such that $0.3 \leq X \leq 0$ holds, when growth is performed by liquid-phase epitaxy of said second step.

4. A method of epitaxially growing a substrate for a high-intensity LED according to any one of claims 1 through 3, wherein a Zn-doped GsAs substrate is used as the GaAs substrate.

* * * * *